United States Patent
Terasawa

[11] 4,016,591
[45] Apr. 5, 1977

[54] SEMICONDUCTOR CONTROLLED RECTIFIER
[75] Inventor: Yoshio Terasawa, Hitachi, Japan
[73] Assignee: Hitachi, Ltd., Japan
[22] Filed: Oct. 15, 1974
[21] Appl. No.: 515,029
[30] Foreign Application Priority Data
Oct. 17, 1973 Japan .............. 48-115909
[52] U.S. Cl. .............. 357/38; 357/20; 357/86
[51] Int. Cl.$^2$ .............. H01L 29/74
[58] Field of Search .............. 357/20, 38, 39, 86
[56] References Cited
UNITED STATES PATENTS

| 3,372,318 | 3/1968 | Tefft | 357/86 |
| 3,476,989 | 11/1969 | Miles et al. | 357/86 |
| 3,586,927 | 6/1971 | Roach et al. | 357/86 |
| 3,731,162 | 5/1973 | Suenaga et al. | 357/38 |
| 3,879,744 | 4/1975 | Dumas | 357/86 |

Primary Examiner—Michael J. Lynch
Assistant Examiner—Joseph E. Clawson, Jr.
Attorney, Agent, or Firm—Craig & Antonelli

[57] ABSTRACT

A semiconductor controlled rectifier comprising a semiconductor substrate having four layers of PNPN types, a pair of main electrodes respectively in ohmic contact with the opposite outer layers, a gate electrode provided to the intermediate P-type layer, a N-type auxiliary region formed in the P-type intermediate layer at such a location that the gate electrode is positioned between the outer N-type layer and the auxiliary region, an auxiliary electrode in contact with the auxiliary region and the P-type intermediate layer, and means for short-circuiting a part of a PN junction formed between the N-type outer layer and the P-type intermediate layer.

13 Claims, 6 Drawing Figures

SEMICONDUCTOR CONTROLLED RECTIFIER

BACKGROUND OF THE INVENTION

1. Field of the Invention

The present invention relates to a semiconductor controlled rectifier which is turned on by a gate signal.

2. Description of the Prior Art

In general, a semiconductor controlled rectifier which turns on upon application of a gate signal to a gate electrode comprises a semiconductor substrate having four continuous layers having alternatively different conduction types of PNPN, a pair of main electrodes respectively in ohmic contact with the outermost layers of the substrate, and a gate electrode in contact with the intermediate layer of the substrate. In such a semiconductor rectifier, if a gate voltage is applied between the gate electrode and one of the main electrodes in contact with the N-type outermost layer with a voltage being applied between the main electrodes so that the one main electrode is at a lower potential than that of the other main electrode is at a lower potential than that of the other main electrode in contact with the P-type outermost layer, a load current begins to flow between the main electrodes of the semiconductor controlled rectifier which has hereunto been in the non-conductive state. The switching of the semiconductor rectifier from the non-conducting state to the conductive state in this way is referred to as that the semiconductor controlled rectifier is turned on. The turn-on of the semiconductor controlled rectifier is performed in such a mechanism that a small area in the vicinity of the gate electrode is initially turned on by the gate current and thereafter the conduction area expands progressively with the elapse of time. Accordingly, if the current increasing rate $di/dt$ is great at the time of the turn-on, the current density in the restricted conduction area near the gate electrode will become excessively large, resulting in the increase in temperature in that area so that the semiconductor controlled rectifier is likely to be thermally damaged or destructed.

There have been proposed various methods to increase the capability of a semiconductor controlled rectifier for the current increasing rate $di/dt$ in an effort to protect the rectifier from the thermal destruction. For example, a semiconductor controlled rectifier is proposed in which a ring-shaped gate electrode is provided so that an initial conduction may occur along the whole periphery of one of the outermost layers. This rectifier has, however, a drawback that a remarkably large gate current is required for the turn-on. One of the most desirable conditions for the semiconductor controlled rectifier is that a large area should become conductive rapidly with a small gate current. As a rectifier which fulfills this condition, a semiconductor controlled rectifier of amplifying gate type or regenerative gate type is known.

In the case of a semiconductor controlled rectifier of amplifying gate type, a small region is formed at a location positioned between the gate electrode in contact with an intermediate layer and one of the outermost layers adjacent thereto, which region is of the same conduction type as that of the outermost layer and is electrically connected to the surface of the intermediate layer through an auxiliary electrode at the side remote from the gate electrode. With such a structure, the gate current from the gate electrode will initially turn on a first four-layer region whose one outer layer is said small region, and subsequently the main region of the semiconductor controlled rectifier (i.e. a second four-layer region whose one outer layer is said one outermost layer) is turned on by the load current flowing through the first four-layer region which then serves as the gate current for the second four-layer region. In this manner, a semiconductor controlled rectifier can be obtained in which the initial conduction can occur rapidly over a relatively large area with a small gate current. However, the rectifier device of the amplifying gate type as mentioned above has a drawback that the minimum value of the forward voltage applied between the main electrodes for turning on the second four-layer region of the semiconductor controlled rectifier will amount to a relatively great value. In more detail, in the semiconductor controlled rectifier of the amplifying gate type, the first four-layer region whose outer layer is said small region is turned to to cause the flow of the load current, as above described. Since this load current will flow into said one outermost layer across the intermediate layer from the auxiliary electrode spaced from the one outermost layer by a predetermined distance, the voltage applied between the main electrodes has to be increased by an amount corresponding to the voltage drop due to the resistance between the one outermost layer and the small region in order that the second four-layer region of the device may be turned on, and thus a higher voltage is required as compared with the case of turning on by the gate current the second four-layer region whose one outer layer is said one outermost layer. The voltage drop becomes greater, as the latching current (the minimum current allowing the forward current to continue to flow) of the first four-layer region is increased, that is, as the semiconductor controlled rectifier has a higher breakdown voltage. In other words, the minimum value of the forward voltage required between the main electrodes for turning on the rectifier device (this minimum voltage will be hereinafter referred to as finger voltage) becomes higher depending upon the increase in the voltage drop between the small region and the one outermost layer. As a result of that, when such semiconductor controlled rectifiers are directly connected in parallel with each other, imbalance in current appears remarkably. More specifically, there may happen such a case that one of the semiconductor controlled rectifiers connected in parallel will remain turned-off until the forward current of the other turned-on semiconductor controlled rectifier is increased so that the forward voltage thereof attains the finger voltage of the turned-off semiconductor controlled rectifier. Accordingly, when the semiconductor controlled rectifiers are connected in parallel with each other, the current imbalance will become greater, as the finger voltage becomes higher. For example, assume that semiconductor controlled rectifiers having respective finger voltages of 1.3 and 1.7 volts are connected directly in parallel with each other. If the gate signal is applied at the time when the voltage applied across the main electrodes exceeds a value greater than the finger voltage (1.7 volts), the difference in time of the above rectifiers being turned on is as small as 0.2 $\mu$ sec. On the contrary, when the gate signal is applied with the smaller forward voltage then the finger voltage (1.7 volts), the difference between the times when the rectifiers are turned on amounts to as great as 2 m sec.

Another disadvantage of the semiconductor controlled rectifier of the amplifying gate type can be seen in the fact that the rectifier may be turned on before the gate signal is applied, in the case where the increasing rate $dv/dt$ of the applied voltage is relatively great or the rectifier is at a relatively high temperature. In the semiconductor controlled rectifier of the amplifying gate type, the small region and the auxiliary electrode are provided in the intermediate layer adjacent to the one outermost layer, as described hereinbefore. Accordingly, the area of the other intermediate layer which is not adjacent to said one outermost layer is larger than the former intermediate layer, as a result of which the displacement current and the reverse leakage current produced in the interior portion of the rectifier which is not covered by the one outermost layer (the portion which is not coincidently superposed on the one outermost layer, when projected in the laminated direction of the layers) is concentrated in the peripheral portion of the one outermost layer. Thus turn-on occurs in the peripheral portion of the one outermost layer before the gate signal is applied. Such a turn-on that occurs before the gate signal is applied (hereinafter referred to as erroneous turn-on) not only renders it impossible to control the semiconductor controlled rectifier, but also thermally destroys the semiconductor controlled rectifier itself. In brief, the rectifier device of the amplifying gate type will certainly provide an advantageous effect that the second four-layer region having the outer layer defined by the one outermost layer can be rapidly turned on over a wide area by initially turning on the first four-layer region having the outer layer defined by the small region. However, the rectifier has the drawback that, in the case where the portion of the second four-layer region with the outer layer thereof defined by the one outermost layer is initially turned on, the load current will be concentrated in such a turned-on portion to thereby bring about, possibly, the thermal destruction of the rectifier device, as above described. It will thus be appreciated that the semiconductor controlled rectifier may erroneously be turned on due to a displacement current or leakage current and thermally destroyed, when the increasing rate $dv/dt$ of the applied voltage is high or the rectifier is at a high temperature.

On the other hand, the semiconductor controlled rectifier of the regenerative gate type is the one wherein one of the outermost layers is provided with a projection which partially projects toward a gate electrode without being connected to the main electrodes, and a given portion of the projection and a portion of an intermediate layer positioned oppositely adjacent to the one outermost layer are electrically connected to each other through an auxiliary electrode. In operation, the projection is first turned on by the gate current from the gate electrode, and the potential difference appearing between the portion of the projection contacted with the auxiliary electrode and the main electrode due to the load current allowed to flow by the turn-on is applied through the auxiliary electrode between the portion of the intermediate layer contacted to the auxiliary electrode and the main electrode to thereby turn on the portion of the one outermost layer located in opposition to the auxiliary electrode. The semiconductor controlled rectifier of this type also has the drawback that the minimum value of the forward voltage required between the main electrodes for turning on the rectifier, namely, the finger voltage is high as is in the case of the semiconductor controlled rectifier of amplifying gate type. In more detail, in the case of the semiconductor controlled rectifier of the regenerative gate type, the first four-layer region having an outer layer defined by the projection is initially turned on, whereby the resulting load current flows into the one outermost layer from the auxiliary electrode across the intermediate layer. When such semiconductor controlled rectifiers of the regenerative gate type are connected directly in parallel with each other, an imbalance in current will become remarkable, as is in the case of the amplifying gate type.

SUMMARY OF THE INVENTION

An object of the present invention is to provide a novel semiconductor controlled rectifier in which the minimum value of the forward voltage between main electrodes necessary for turning on the rectifier, that is, the finger voltage can be made small.

Another object of the invention is to provide a novel semiconductor controlled rectifier having a large capability for a current increasing rate $di/dt$, which is capable of turning on a relatively wide area or region with a small current.

Still another object of the invention is to provide a novel semiconductor controlled rectifier having a large capability for a voltage increasing rate $dv/dt$ and a high or good resistance to a high temperature.

A further object of the invention is to provide a novel semiconductor controlled rectifier which is suitable for use in a direct parallel connection.

To accomplish these objects, there is provided, according to the invention, a semiconductor controlled rectifier characterized by the construction in which a portion of a main four-layer region and an auxiliary four-layer region for the gate current amplification are turned on by the gate current, and a displacement current as well as a leakage current are caused to flow to a main electrode without exerting any influence on the main four-layer region. More specifically, in the semiconductor controlled rectifier according to the invention, the intermediate layer in contact with the gate electrode is formed with an auxiliary region of the conduction type reverse to that of the intermediate layer, which region is positioned opposite to one of the outermost layers adjacent to the intermediate layer with the gate electrode being interposed. A portion of the surface of intermediate layer is in contact with the auxiliary region and the remaining portion forms an auxiliary electrode on the one outermost layer in a positional relation opposing to each other with a constant space therebetween. Further, means is provided for short-circuiting an exposed portion of a PN junction between said outermost layer and the intermediate layer at a location remote from the gate electrode.

DESCRIPTION OF THE PREFERRED EMBODIMENTS

Now the invention will be described with reference to the drawings showing preferred embodiments of the semiconductor controlled rectifier according to the invention.

Figure 1:
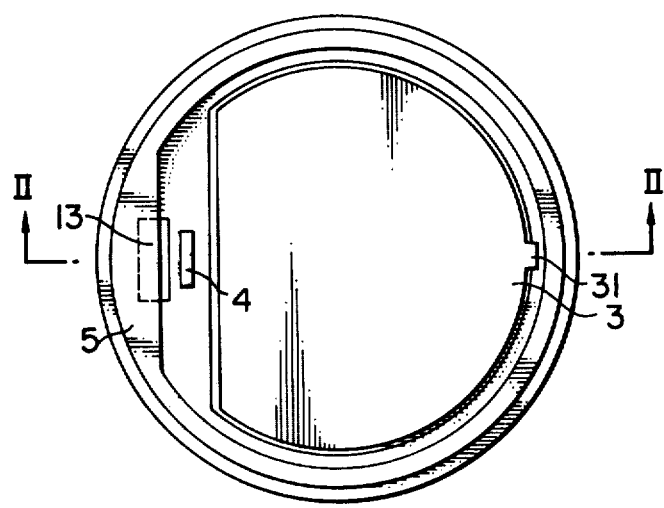
FIG. 1 is a plan view showing an embodiment of the semiconductor controlled rectifier according to the invention.
Figure 2:
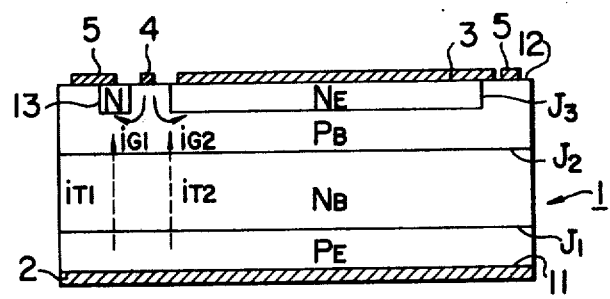
FIG. 2 is a sectional view of the rectifier taken along line II—II in FIG. 1.

In FIGS. 1 and 2 which illustrate a first embodiment of the semiconductor controlled rectifier according to the invention, reference numeral 1 indicates a semiconductor substrate composed of four continuous layers having alternatively different conduction types of $P_E$, $N_B$, $P_B$, and $N_E$ between a pair of opposite principal surfaces 11 and 12. Reference symbol $P_E$ indicates an emitter layer of P-type (hereinafter referred to as $P_E$ layer), $N_B$ a base layer of N-type (hereinafter referred to as $N_B$ layer) forming a first PN junction $J_1$ with the $P_E$ layer, $P_B$ a base layer of P-type (hereinafter referred to as $P_B$ layer) forming a second PN junction $J_2$ with the $N_B$ layer, and $N_E$ an emitter layer of N-type conduction (hereinafter referred to as $N_E$ layer) forming a third PN junction $J_3$ with the $P_B$ layer.

Numeral 13 denotes an auxiliary region of N-type isolated from the $N_E$ layer by the $P_B$ layer and having an area smaller than that of the $N_E$ layer. One surface of the N-type region 13 is embedded within the $P_B$ layer, while the other surfaces 12 of the substrate 1. Reference numeral 2 indicates a main electrode in ohmic contact with the $P_E$ layer at the one principal surface 11 of the substrate 1, while numeral 3 indicates the other main electrode in ohmic contact with the $N_E$ layer at the other principal surface 12. Formed at a peripheral portion of the main electrode 3 is a projection 31 which serves to short-circuit the third PN junction $J_3$ at a location remote from the auxiliary region 13. A gate electrode 4 is formed in the exposed surface of the $P_B$ layer at the position between the $N_E$ layer and the auxiliary region 13. Formed in the surface of the $P_B$ layer defined by the principal surface 12 of the substrate 1 is an auxiliary electrode 5 a portion of which is in contact with the auxiliary region 13, while the remaining portion thereof is disposed opposite to the periphery of the $N_E$ layer with a predetermined space therebetween, as is clearly shown in FIG. 1. It will further be noted that the auxiliary electrode 5 is contacted to the auxiliary region 13 in such a manner that the portion of the region 13 facing the gate electrode 4 remains exposed. The auxiliary electrode 5 is positioned also in contact with the $P_B$ layer at the outer periphery thereof outside of the auxiliary region 13. The gate electrode 4 is disposed at such a position that the four-layer region having the auxiliary layer 13 can be turned on slightly earlier than the four-layer region having the $N_E$ layer. In other words, the arrangement is so dimensioned that the density of gate current $i_{G1}$ flowing into the auxiliary region 13 from the gate electrode 4 is greater than the density of gate current $i_{G2}$ flowing into the $N_E$ layer from the gate electrode 4. To this end, the gate electrode 4 may be disposed nearer the auxiliary region 13. Alternatively, the portion of the $P_B$ layer lying between the gate electrode 4 and the $N_E$ layer may be made thin.

Next, the operation of the semiconductor controlled rectifier of the construction mentioned above will be described. It is assumed that the rectifier is in a so-called forwardly blocked state wherein a voltage is applied between the main electrodes 2 and 3 with the electrode 3 being at a high potential. When a gate voltage is applied between the gate electrode 4 and the main electrode 3 with the gate electrode 4 being at a high potential, a gate current will then flow from the gate electrode 4 into the auxiliary region 13 and the $N_E$ layer. The amount of the gate current is determined by the resistances of the path extending from the gate electrode 4 to the $N_E$ layer through the auxiliary region 13 and the auxiliary electrode 5 and the path extending from the gate electrode 4 directly to the $N_E$ layer. Since a greater amount of gate current will flow into the auxiliary region 13 than the $N_E$ layer due to the aforementioned arrangement, the four-layer region having one outer layer defined by the auxiliary region 13 is initially turned on, which results in the flowing of load current $i_{T1}$ through the auxiliary electrode 5 into the $N_E$ layer positioned opposite to the electrode 5, whereby the four-layer region having one outer layer defined by the $N_E$ layer is turned on at the peripheral portion thereof positioned opposite to the auxiliary electrode 5. Because the gate current flowing from the density of the gate electrode 4 into the portion of the $N_E$ layer facing the gate electrode 4 is less than the density of the gate current flowing into the auxiliary region 13, the turn-on of the $N_E$ layer will occur with a slight delay to the turn-on of the four-layer region defined by the auxiliary region 13. In this manner, a large capability for the current increasing rate $di/dt$ in the initial phase of the turn-on can be obtained. In order that the prior known rectifier may perform the above operation, it is necessarily presumed that the voltage applied across the main electrodes has to be greater than a minimum value required to cause the load current $i_{T1}$ to flow in response to the gate current $i_{G1}$. In contrast, in the case of the semiconductor controlled rectifier according to the invention, load current $i_{T2}$ can be made to flow in response to the gate current $i_{G2}$ even when the load current $i_{T1}$ can not be produced owing to the low level of voltage applied across the main electrodes. In other words, the load current $i_{T2}$ begins to flow at an applied voltage which is lower than the one required to cause the flow of the load current $i_{T1}$ for a value corresponding to the voltage drop produced by the load current $i_{T1}$ flowing from the auxiliary electrode 5 into the $N_E$ layer through the $P_B$ layer. Accordingly, it is possible to lower the minimum value of the forward voltage required between the main electrodes for turning on the rectifier, i.e. the finger voltage, as compared with the hitherto known semiconductor controlled rectifier having a large capability for the current increasing rate $di/dt$. Thus, a semiconductor controlled rectifier can be obtained which produces no or a negligible imbalance of current when connected directly in parallel with each other. Furthermore, since the projection 31 forming a part of the main electrode 3 is so arranged as to short-circuit the third PN junction $J_3$, a displacement current as well as a reverse leakage current produced in the rectifier, particularly in the peripheral portion of the semiconductor substrate are collected by the auxiliary electrode 5 and flow into the $N_E$ layer without flowing through the third junction $J_3$ by way of the projection 31, which thus allows enhancement of a capability for the voltage increasing rate $dv/dt$.

Figure 3:
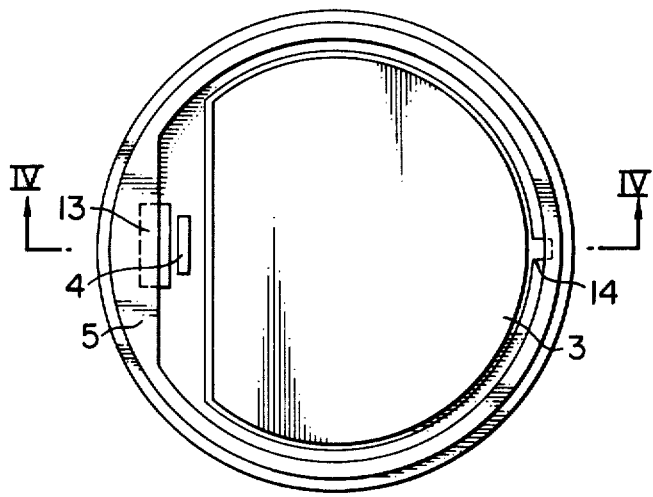
FIG. 3 is a plan view of another embodiment of the semiconductor controlled rectifier according to the invention.
Figure 4:
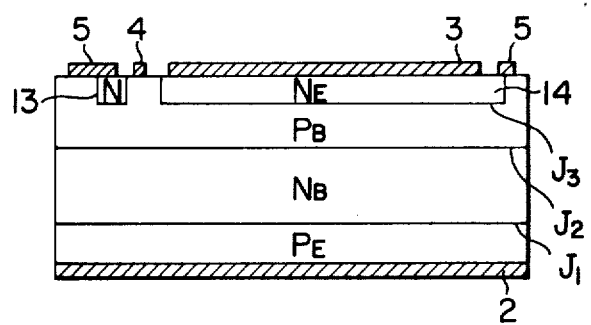
FIG. 4 is a sectional view of the rectifier shown in FIG. 3 taken along line IV—IV thereof.

Referring to FIGS. 3 and 4 which illustrate a second exemplary embodiment of the semiconductor controlled rectifier according to the invention, this rectifier is different from the one shown in FIGS. 1 and 2 in that a portion of the third PN junction $J_3$ is short-circuited by a portion of the auxiliary electrode. More specifically, an exposed portion of the third PN junction $J_3$ remote from the gate electrode 4 is extended partially into the area of the auxiliary electrode 5 and contacted thereto. The other structure of the device is the same as that of the rectifier shown in FIGS. 1 and 2 and therefore the same reference numerals are employed to indicate like portions. Although the semiconductor controlled rectifier shown in FIGS. 3 and 4 is different from the one shown in FIGS. 1 and 2 in respect of concrete arrangement for improving the capability for the voltage increasing rate $dv/dt$, the intended objects of the present invention can be accomplished to the same effect as is in the case of the first embodiment of FIGS. 1 and 2.

Figure 5:
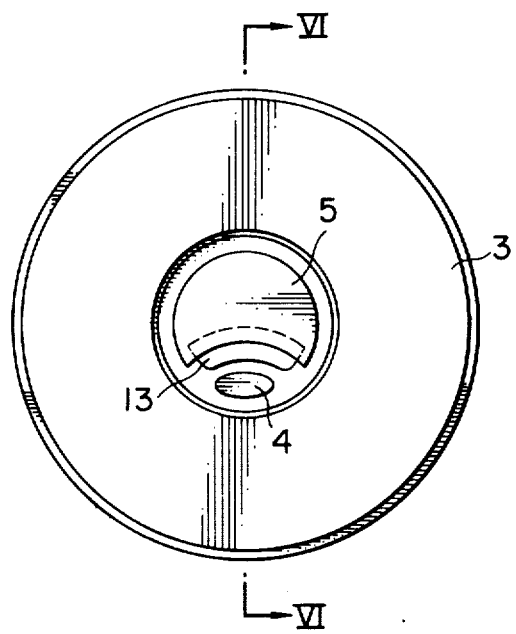
FIG. 5 is a plan view showing still another embodiment of the semiconductor controlled rectifier according to the invention.
Figure 6:
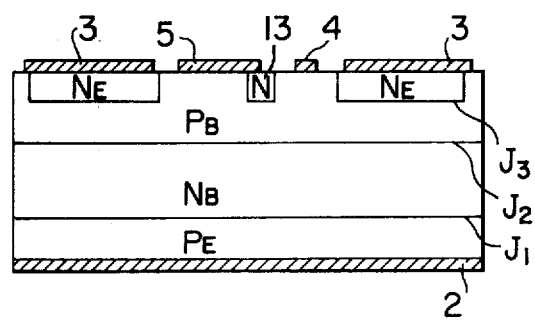
FIG. 6 shows a section taken along line VI—VI in FIG. 5.

FIGS. 5 and 6 show a third exemplary embodiment of the semiconductor controlled rectifier according to the invention which is characterized by a center gate arrangement. More concretely, the semiconductor controlled rectifier shown in FIGS. 5 and 6 has the $N_E$ layer formed in a ring-shaped configuration so that the $P_B$ layer is exposed inside the inner periphery of the $N_E$ layer, i.e. at the central portion of the device. The auxiliary region 13 of N-type is formed in the $P_B$ layer encircles or enclosed by the $N_E$ layer with upper surface thereof being exposed. The main electrode 3 is disposed on the surfaces both of the $N_E$ layer and the $P_B$ layer located outside of the outer periphery of the $N_E$ layer. The gate electrode 4 is provided on the $P_B$ layer between the auxiliary region 13 and the $N_E$ layer. Further provided mainly in contact with the surface of the $P_B$ layer and partially contacted to the auxiliary region 13 at the side thereof remote from the gate electrode 4 is the auxiliary electrode 5 having a periphery located opposite to the inner periphery of the $N_E$ layer with a predetermined space therebetween. Concerning the position at which the gate electrode 4 is to be disposed, the same consideration must be paid as is in the case of the first embodiment. With the structure described above, a more advantageous effect can be attained in respect of the improvement in the capability for the voltage increasing rate $dv/dt$, as compared with the first and second embodiment. In general, most of the leakage current is produced in the peripheral portion of the semiconductor substrate. Accordingly, it is necessary to make the leakage current to flow into the $N_E$ layer by shunting the third PN junction. To this end, all the exposed portion of the third PN junction $J_3$ along the outer periphery thereof is short-circuited by the main electrode 3 in the embodiment shown in FIGS. 5 and 6. Then, the leakage current may flow into the $N_E$ layer without transversing the $P_B$ layer in the direction parallel with the plane of the main surface 3, which in turn improves effectively the capability for the voltage increasing rate $dv/dt$.

If a projection serving to short-circuit the third PN junction $J_3$ at a location remote from the gate electrode 4 is formed, in the embodiment of FIGS. 5 and 6, in the inner peripheral porton of the main electrode 3, as designated at 31 in FIG. 1, or if a portion of the $N_E$ layer is extended, in the embodiment of FIGS. 5 and 6, to the auxiliary electrode 5, as designated at 14 in FIGS. 3 and 4, the capability for the voltage increasing rate $dv/dt$ may be further improved.

In the foregoing, preferred or typical embodiments of the semiconductor controlled rectifier according to the invention have been described. However, it should be appreciated that the present invention is never restricted to these illustrated embodiments and various modifications are conceivable without departing from the spirit and scope of the invention. For example, in the first to third embodiments, the conduction types of the various layers and regions may be reversed. The $N_E$ layer and the auxiliary electrode 5 may be contoured in a comb tooth-shaped configuration and interlaced with each other. Further, in the first and second embodiments, the auxiliary electrode 5 may be employed in other forms other than the ring-shaped configuration, and so forth.

Finally, the effects attained by the invention will be described with the aid of a numerical example. At first, the semiconductor controlled rectifiers of the invention shown in FIGS. 1 and 2 were compared with a conventional semiconductor controlled rectifier of the amplifying gate type having the auxiliary electrode formed in a ring-shaped configuration so as to encircle one of the outermost layers. In the case of the rectifier according to the invention, the finger voltage was lower than that of the conventional rectifier by 0.47 V at the rated voltage of 2500 V and by 2.3 V at the rated voltage of 4000 V. In respect of the capability for the voltage increasing rate $dv/dt$, 2400 V/$\mu$s could be attained in the device according to the invention while 800 V/$\mu$s of the conventional rectifiers. In this case, both rectifiers were rated at 2500 V and 400 A with the peak-to-peak value of the applied voltage being at 700 V. Temperature was at 125° C. As will be appreciated from the above comparison, the semiconductor controlled rectifier according to the invention is very advantageous over the prior ones.

I claim:
1. A semiconductor controlled rectifier comprising:
a semiconductor substrate having a pair of opposite principal surfaces and four contiguous layers between said principal surfaces having alternatively different conduction types, PN junctions being formed between the adjacent ones of said four layers, at least one of said principal surfaces being formed by exposed surfaces of one of the outermost layers of said four layers and the intermediate layer adjacent thereto;
a pair of main electrodes disposed on said principal surfaces in ohmic contact with said outermost layers respectively;
a gate electrode disposed on said one principal surface in contact with said intermediate layer;
an auxiliary region in said intermediate layer having a conduction type reverse to that of said intermediate layer, a smaller area than that of said one outermost layer and a surface exposed in said one principal surface, said gate electrode being positioned between said one outermost layer and said auxiliary region and being spaced apart from both thereof;
an auxiliary electrode disposed on said one principal surface at a portion thereof in contact with said auxiliary region and at the remaining portion thereof in contact with said intemediate layer, said remaining portion of said auxiliary electrode including a part positioned by a predetermined space apart from said main electrode which is in ohmic contact with said one outermost layer and a part spaced by way of said auxiliary region from a portion of said intermediate layer in contact with said gate electrode; and means for short-circuiting the exposed portion of the PN junction formed between said one outermost layer and said intermediate layer at a location remote from said gate electrode.

2. A semiconductor controlled rectifier comprising:
a semiconductor substrate having a pair of opposite principal surfaces and four contiguous layers between said principal surfaces having alternatively different conduction types, PN junctions being formed between the adjacent ones of said four layers, at least one of said principal surfaces having a central portion formed by said one outermost layer and a peripheral portion formed by an exposed surface of the intermediate layer adjacent to said one outermost layer;
a pair of main electrodes disposed on said principal surfaces in ohmic contact with said outermost layers respectively;
a gate electrode disposed on said one principal surface in contact with said intermediate layer;
an auxiliary region in said intermediate layer having a conduction type reverse to that of said intermediate layer, a smaller area than that of said one outermost layer and a surface exposed in said one principal surface, said gate electrode being positioned between said one outermost layer and said auxiliary region and being spaced apart from both thereof;
an auxiliary electrode disposed on said one principal surface at a portion thereof in contact with said auxiliary region and at the remaining portion thereof in contact with said intermediate layer, said remaining portion of said auxiliary electrode including a part positioned by a predetermined space apart from said main electrode and being in ohmic contact with said one outermost layer and a part spaced by way of said auxiliary region from a portion of said intermediate layer in contact with said gate electrode; and
means for short-circuiting the exposed portion of the PN junction formed between said one outermost layer and said intermediate layer at a location remote from said gate electrode.

3. A semiconductor controlled rectifier as set forth in claim 2, wherein said auxiliary electrode extends along the periphery of said one outermost layer.

4. A semiconductor controlled rectifier as set forth in claim 2, wherein said short-circuiting means is formed by extending a portion of the main electrode in ohmic contact with said one outermost layer to the surface of said intermediate layer.

5. A semiconductor controlled rectifier as set forth in claim 2, wherein said short-circuiting means is formed by a portion of said one outermost layer extended to said auxiliary electrode.

6. A semiconductor controlled rectifier comprising:
a semiconductor substrate having first and second opposite principal surfaces and containing
a first semiconductor layer of a first conductivity type having first and second opposite surfaces, the second surface of said first layer forming the second surface of said substrate,
a second semiconductor layer of a second conductivity type, opposite said first conductivity type, disposed on the first surface of said first layer and defining a first PN junction therewith,
a third semiconductor layer of said first conductivity type having first and second opposite surfaces, the second surface of said third layer being disposed on said second layer and defining a second PN junction therewith, the first surface of said third layer coinciding with the first surface of said substrate,
a first semiconductor region of said second conductivity type disposed in a first prescribed surface portion of said third layer, extending to the first surface thereof and defining therewith a third PN junction, and
a second semiconductor region of said second conductivity type disposed in a second prescribed surface portion of said third layer spaced apart from said first region in said first prescribed surface portion of said third layer by the semiconductor material of said third layer therebetween and defining a fourth PN junction with said third layer;
a first main electrode disposed in ohmic contact with said first layer at the second surface of said substrate;
a second main electrode disposed in ohmic contact with said first region at the first surface of said substrate;
a gate electrode disposed in ohmic contact exclusively with said third layer at a third surface portion thereof disposed between and spaced apart from said first and second surface portions of said third layer;
an auxiliary electrode disposed on the first principal surface of said substrate and overlapping and short-circuiting part of said fourth PN junction while leaving the portion of said fourth PN junction which is closest to said gate electrode exposed at said first surface of said substrate; and
means for short-circuiting a portion of said third PN junction at a location remote from said gate electrode.

7. A semiconductor controlled rectifier according to claim 6, wherein said auxiliary electrode further extends along and is spaced apart from the periphery of said second main electrode.

8. A semiconductor controlled rectifier according to claim 7, wherein said short-circuiting means comprises a protruding portion of said second main electrode, diametrically opposite the portion thereof facing said gate electrode, overlapping and short-circuiting said third PN junction.

9. A semiconductor controlled rectifier according to claim 7, wherein said short-circuiting means comprises an extending portion of said first region, diametrically opposite the portion thereof closes to said gate electrode, which extending portion is partially overlapped and short-circuited by said auxiliary electrode.

10. A semiconductor controlled rectifier according to claim 9, wherein said second main electrode is in ohmic contact exclusively with said first semiconductor region.

11. A semiconductor controlled rectifier according to claim 6, wherein said short-circuiting means comprises an outer edge portion of said second main electrode overlapping and short-circuiting a portion of said third PN junction.

12. A semiconductor controlled rectifier comprising:
a semiconductor substrate having a pair of opposite principal surfaces and four contiguous layers between said principal surfaces having alternatively different conduction types, PN junctions being formed between the adjacent ones of said four layers, one of said outermost layers being in a ring-shaped configuration and embedded within the intermediate layer with a surface thereof exposed so that one of said principal surfaces comprises exposed surfaces of said one outermost layer and said intermediate layer;

a first main electrode on said one principal surface in ohmic contact with said one outermost layer and said intermediate layer located at the side of the outer periphery of said one outermost layer;

a second main electrode on the other principal surface in ohmic contact with said one outermost layer;

a gate electrode on said one principal surface in contact with said intermediate layer at the portion encircled by said one outermost layer;

an auxiliary region in said intermediate layer encircled by said one outermost layer having a conduction type reverse to that of said intermediate layer and a smaller area than that of said one outermost layer, said auxiliary region having a surface exposed in said one principal surface, said gate electrode being positioned between said one outermost layer and said auxiliary region and being spaced apart from both thereof;

an auxiliary electrode disposed on said one principal surface at a portion thereof in contact with said auxiliary region and at the remaining portion thereof in contact with said intermediate layer, said remaining portion of said auxiliary electrode including a part positioned by a predetermined space apart from said main electrode and being in ohmic contact with said one outermost layer and a part spaced by way of said auxiliary region from a portion of said intermediate layer in contact with said gate electrode; and means for shortcircuiting the exposed portion of the PN junction formed between said one outermost layer and said intermediate layer at a location remote from said gate electrode, said short-circuiting means being formed by extending a portion of the main electrode in ohmic contact with said one outermost layer to the surface of said intermediate layer.

13. A semiconductor controlled rectifier comprising:
a semiconductor substrate having a pair of opposite principal surfaces and four contiguous layers between said principal surfaces having alternatively different conduction types, PN junctions being formed between the adjacent ones of said four layers, one of said outermost layers being in a ring-shaped configuration and embedded within the intermediate layer with a surface thereof exposed so that one of said principal surfaces comprises exposed surfaces of said one outermost layer and said intermediate layer;

a first main electrode on said one principal surface in ohmic contact with said one outermost layer and said intermediate layer located at the side of the outer periphery of said one outermost layer;

a second main electrode on the other principal surface in ohmic contact with said one outermost layer;

a gate electrode on said one principal surface in contact with said intermediate layer at the portion encircled by said one outermost layer;

an auxiliary region in said intermediate layer encircled by said one outermost layer having a conduction type reverse to that of said intermediate layer and a smaller area than that of said one outermost layer, said auxiliary region having a surface exposed in said one principal surface, said gate electrode being positioned between said one outermost layer and said auxiliary region and being spaced apart from both thereof;

an auxiliary electrode disposed on said one principal surface at a portion thereof in contact with said auxiliary region and at the remaining portion thereof in contact with said intermediate layer, said remaining portion of said auxiliary electrode including a part positioned by a predetermined space apart from said main electrode and being in ohmic contact with said one outermost layer and a part spaced by way of said auxiliary region from a portion of said intermediate layer in contact with said gate electrode; and means for shortcircuiting the exposed portion of the PN junction formed between said one outermost layer and said intermediate layer at a location remote from said gate electrode, said shortcircuiting means being formed by a portion of said one outermost layer extended to said auxiliary electrode.

* * * * *